(12) United States Patent
Tailliet et al.

(10) Patent No.: US 8,884,689 B2
(45) Date of Patent: Nov. 11, 2014

(54) LOW PASS FILTER WITH AN INCREASED DELAY

(71) Applicant: STMicroelectronics (Rousset) SAS, Rousset (FR)

(72) Inventors: Francois Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/868,866

(22) Filed: Apr. 23, 2013

(65) Prior Publication Data

US 2013/0278330 A1  Oct. 24, 2013

(30) Foreign Application Priority Data

Apr. 24, 2012 (FR) .................................. 12 53734

(51) Int. Cl.
  *H03B 1/00* (2006.01)
  *H03K 5/1252* (2006.01)
  *H03K 5/13* (2014.01)
  *H03H 11/04* (2006.01)
  *H03K 5/00* (2006.01)

(52) U.S. Cl.
  CPC ............. *H03H 11/04* (2013.01); *H03K 5/1252* (2013.01); *H03K 5/13* (2013.01); *H03K 2005/00156* (2013.01)
  USPC .......................................... 327/558; 327/290

(58) Field of Classification Search
  USPC ......... 327/261, 263, 268, 276, 283, 290, 551, 327/552, 553, 558
  See application file for complete search history.

(56) References Cited

U.S. PATENT DOCUMENTS

| | | | |
|---|---|---|---|
| 5,600,282 A * | 2/1997 | Austin et al. .................. | 331/111 |
| 5,929,681 A | 7/1999 | Suzuki | |
| 6,456,137 B1 * | 9/2002 | Asao ............................. | 327/290 |
| 7,154,324 B1 * | 12/2006 | Maangat et al. .............. | 327/288 |
| 8,154,324 B2 * | 4/2012 | Locatelli et al. .............. | 327/109 |
| 8,610,248 B2 * | 12/2013 | Liang et al. ................... | 257/532 |
| 2010/0019819 A1 | 1/2010 | Wu et al. | |

* cited by examiner

*Primary Examiner* — Jeffrey Zweizig
(74) *Attorney, Agent, or Firm* — Seed IP Law Group PLLC

(57) ABSTRACT

A low pass filter comprises a filter input node configured to receive a first logic signal, a filter output node configured to supply a second logic signal, a resistive element comprising a first terminal coupled to the input node and a second terminal coupled to the output node, and a capacitive element comprising a first terminal coupled to the output node and a second terminal. The filter further comprises an inverting gate having a first terminal coupled to the input node and a second terminal coupled to the second terminal of the capacitive element.

23 Claims, 4 Drawing Sheets

LOW PASS FILTER WITH AN INCREASED DELAY

BACKGROUND

1. Technical Field

The present disclosure relates to a low pass RC filter, and to an integrated circuit comprising such a filter.

2. Description of the Related Art

FIG. 1 shows a conventional low pass RC filter F0 comprising a filter input node N1, a filter output node N2, a resistor R, and a capacitor C. The resistor R has a first terminal coupled to node N1, and a second terminal coupled to node N2. The capacitor C has a first terminal (or positive plate) coupled to node N2, and a second terminal (or negative plate) coupled to ground GND. Filter F0 further comprises a first inverting gate IG1 and a second inverting gate IG2. Gate IG1 is coupled on input to a node N0 and on output to node N1, and gate IG2 is coupled on input to node N2 and on output to a node N3. Inverting gates IG1, IG2 are each electrically powered by a voltage +V, and are coupled to ground (not shown in FIG. 1). Furthermore, node N1 receives a first logic signal S1 (filter input signal), and node N2 supplies a second logic signal S2 (filter output signal).

Filter F0 may be implemented in various circuits such as ring oscillators, buses, etc. for diverse applications such as communications and automotive. If the signal at node N1 is at a high voltage value, the capacitor C gradually charges through resistor R at a rate according to a time constant $\tau$ (tau). Likewise, if the signal at node N1 is at a low voltage value (grounded), the capacitor C gradually discharges through resistor R according to the same time constant. The time constant is the product of resistance R and capacitance C, such that one time constant $\tau$ is equal to the amount of time the capacitor takes to reach 63% of the supply voltage +V. It is well known that the capacitor is fully charged or discharged after a period of $5*\tau$, and is approximately 50% charged or discharged after a period of $\ln(2)*\tau \sim 0.7*RC$ [seconds]. The voltage VC of the capacitor C is equal to the potential difference between its two terminals (or plates).

FIG. 2 shows timing diagrams of the logic signals S0, S1, S2, S3 at nodes N0, N1, N2, N3 as well as the capacitor voltage VC over time t. For the sake of simplicity, it is assumed in the following that the switching time of the inverting gates IG1, IG2 is instantaneous, and that the switching point of inverting gate IG2 is equal to +V/2.

Initially, signal S0 is at a low logic value "0" (ground GND), signal S1 is at a high logic value "+V", signal S2=+V, and signal S3=0. The positive plate of the capacitor C is coupled to the electrical power supply +V by means of the inverting gate IG1, and the negative plate is grounded. The capacitor is fully charged, such that VC=+V.

At a time t1, the signal S0 switches from 0 to +V and the signal S1=0 on output of gate IG1. The capacitor C is decoupled from the power supply, and begins to discharge from voltage +V to 0. Consequently, the voltage at node N2 begins to decrease from +V. Signal S3 remains at 0.

At a time t2, the decreasing voltage at node N2 crosses the switching point +V/2 of inverting gate IG2, such that the signal S3 switches from 0 to +V on output of gate IG2. The delay between times t1, t2 corresponds to a rise time delay d1 of the filter F0.

At a time t3, the signal S0 switches from +V to 0, and the signal S1 returns to +V. The capacitor C is again coupled to the electrical power supply and begins to charge from 0 to voltage +V. Consequently, the voltage begins to increase at node N2. Signal S3 remains at +V.

At a time t4, the increasing voltage at node N2 crosses the switching point +V/2 of the inverting gate IG2, such that the signal S3 switches from +V to 0 on output of gate IG2. The delay between times t3, t4 corresponds to a fall time delay d2 of the filter F0.

FIG. 2 therefore illustrates the delay of the low pass filter F0 on output in response to a change (low to high, or high to low) occurring at the filter input node N1. Consequently, a pulse of signal S1 applied at the filter input node N1 with a width less than the amount of time during which the voltage at node N2 charges or discharges to the switching point +V/2 from a discharged or charged condition does not cause a logic state change at node N3. As a result, pulses or "glitches" less than the delay d1, d2 (i.e., $d=0.7*\tau$ seconds) are filtered out.

As an illustrative example, if a delay d=100 nS is desired, the time constant $\tau=100/0.7\sim140$ nS=R*C. For a maximum capacitance of 1 pF of the capacitor C, the resistance of the resistor R is equal to 140 kOhms. When implemented on a semiconductor substrate, the resistance is dependent upon a sheet resistance [Ohms/square]. For a typical sheet resistance of 1 kOhms/square, 140 squares of semiconductor surface area would be used to implement the resistor R. Furthermore, the capacitor C is implemented as two plates parallel to the surface of the semiconductor substrate such that the surface area occupied by the resistor and the capacitor is non-negligible. If it is desired to have an increased delay d, the size of the resistor and capacitor may be preventively large.

BRIEF SUMMARY

It may be desired to provide a low pass filter with a greater delay for given resistor and capacitance values.

One embodiment of the disclosure is a low pass filter comprising a filter input node configured to receive a first logic signal, a filter output node configured to supply a second logic signal, a resistive element comprising a first terminal coupled to the input node and a second terminal coupled to the output node, and a capacitive element comprising a first terminal coupled to the output node and a second terminal, wherein the filter further comprises means for supplying a third logic signal, which is the inverse of the first logic signal, to the second terminal of the capacitive element.

According to one embodiment, the means for supplying the third logic signal comprise a first inverting gate coupled on output to the filter input node, and a second inverting gate coupled on input to the filter output node.

According to one embodiment, the second terminal of the capacitive element is coupled to the input of the first inverting gate.

According to one embodiment, the filter further comprises an inverting gate coupled to the input node on input and to the second terminal of the capacitive element on output.

According to one embodiment, the inverting gate is electrically powered by a voltage supply higher than a voltage supply supplying the first logic signal.

According to one embodiment, the first logic signal varies between a low voltage value and a first high voltage value, and the third logic signal varies between a low voltage value and a second high voltage value greater than the first high voltage value.

According to one embodiment, the filter further comprises a delay adjusting means configured to receive on one input an enable signal, and on another input the first logic signal, and to supply the third logic signal on output only when the enable signal is enabled.

According to one embodiment, the capacitive element is an equivalent capacitor comprising two or more capacitors coupled in parallel.

According to one embodiment, the equivalent capacitor is a stacked capacitor implemented on a semiconductor substrate.

Embodiments of the disclosure also relate to an integrated circuit comprising a low pass filter according to one embodiment.

Embodiments of the disclosure also relate to a device comprising a low pass filter according to one embodiment.

Embodiments of the disclosure also relate to a method of filtering a first logic signal by means of filtering means comprising input and output nodes, a resistive element comprising a first terminal coupled to the input node and a second terminal coupled to the output node, and a capacitive element comprising a first terminal coupled to the output node and a second terminal, the method comprising applying the first logic signal to the input node, supplying a second logic signal at the output node, and supplying a third logic signal, which is the inverse of the first logic signal, to the second terminal of the capacitive element.

According to one embodiment, the method further comprises supplying a delay adjusting means receiving on one input an enable signal and on another input the logic signal present at the input node, and supplying on output the inverse input logic signal to the second terminal of capacitive means.

According to one embodiment, the method further comprises varying the first logic signal between a low voltage value and a first high voltage value, and varying the third logic signal between a low voltage value and a second high voltage value greater than the first high voltage value.

BRIEF DESCRIPTION OF THE SEVERAL VIEWS OF THE DRAWINGS

Embodiments of the present disclosure will now be described in connection with, but not limited to, the appended drawings in which.

DETAILED DESCRIPTION

Figure 3:
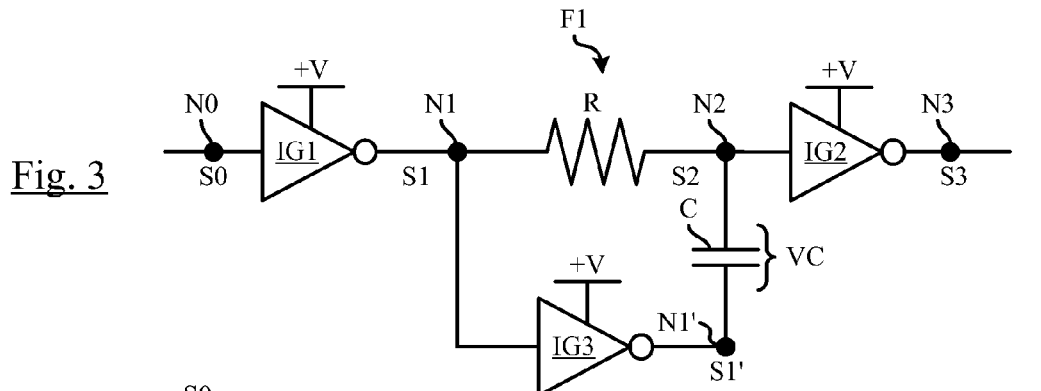
FIG. 3 shows a low pass filter according to one embodiment of the disclosure.

FIG. 3 shows a low pass filter F1 according to one embodiment of the disclosure. Filter F1 comprises a filter input node N1, a filter output node N2, an inverse input node N1', a resistor R, and a capacitor C. The resistor R has a first terminal coupled to node N1 and a second terminal coupled to node N2. The capacitor C has a first terminal (or positive plate) coupled to node N2, and a second terminal (or negative plate) coupled to node N1'. A first logic signal S1 (filter input signal) is supplied at node N1, a second logic signal S2 (filter output signal) is supplied at node N2, and a third logic signal S1' is supplied at node N1', wherein the third logic signal S1' (inverse input signal) is the inverse of the first logic signal S1.

Filter F1 further comprises a first inverting gate IG1, a second inverting gate IG2, and a third inverting gate IG3. Gate IG1 is coupled on input to a node N0 and on output to node N1, and gate IG2 is coupled on input to node N2 and on output to a node N3. Gate IG3 is coupled on input to node N1 and on output to node N1'. Gate IG3 thus supplies the inverse of signal S1 to node N1' as signal S1'. Inverting gates IG1, IG2, IG3 are each electrically powered by a voltage +V, and are also coupled to ground (not shown in the figures).

Figures 1, 2:
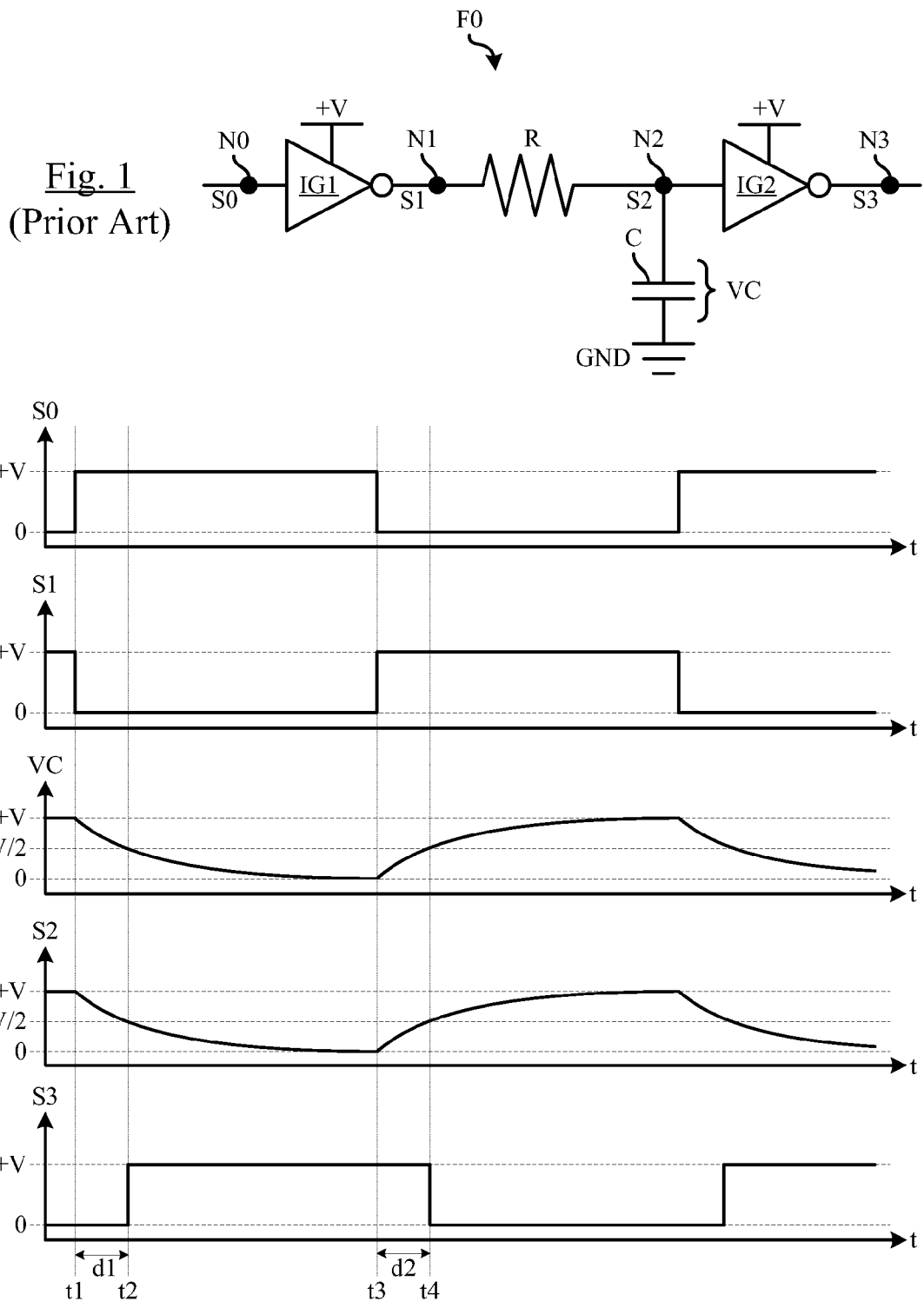
FIG. 1, previously described, shows a conventional low pass filter.
FIG. 2, previously described, shows timing diagrams for the filter of FIG. 1.
Figure 4:
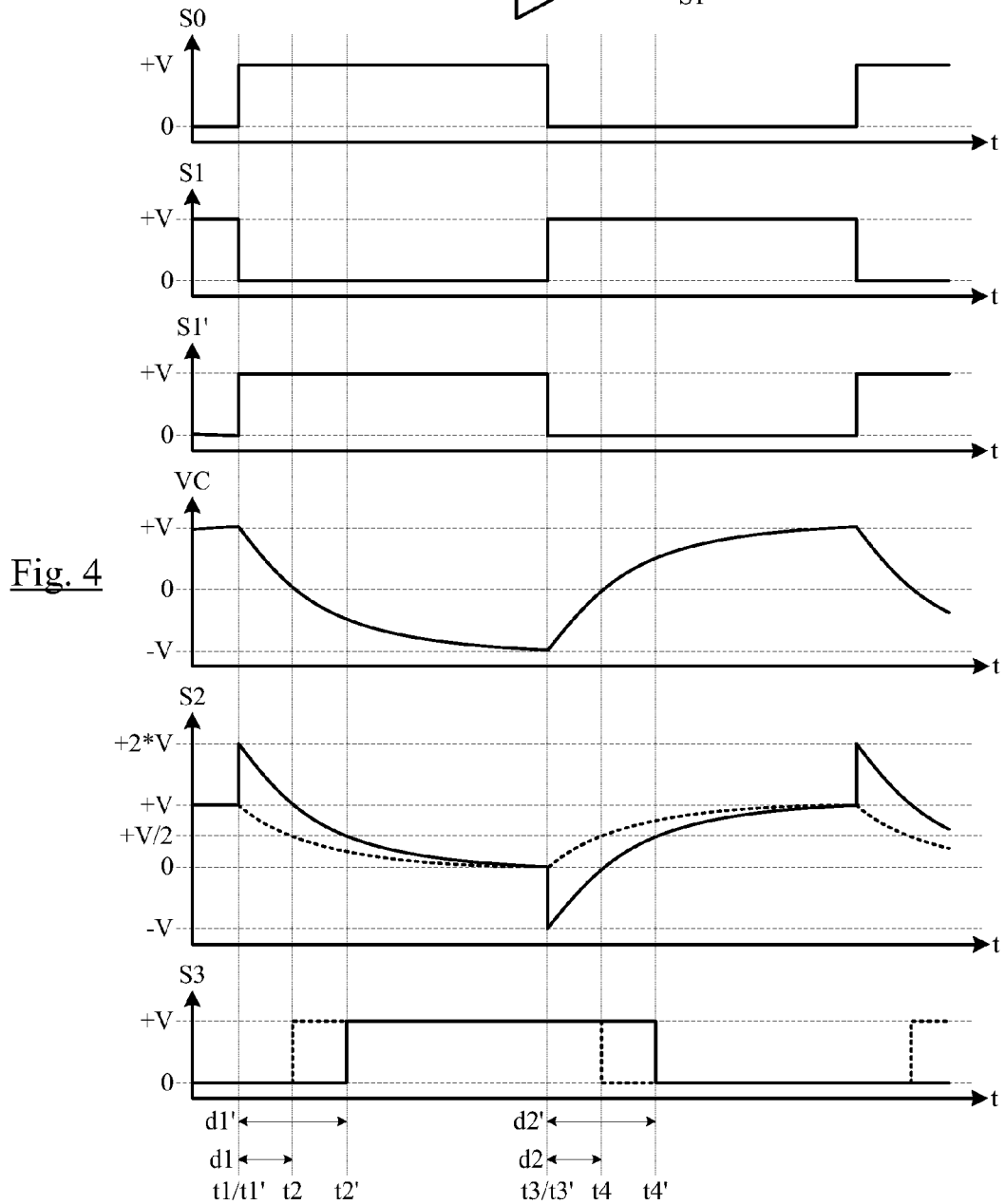
FIG. 4 shows timing diagrams for the filter of FIG. 3.

FIG. 4 shows timing diagrams of the logic signals S0, S1, S1', S2, S3 at nodes N0, N1, N1', N2, N3 as well as the capacitor voltage VC over time t. For the sake of simplicity, it is assumed in the following that the switching time of the inverting gates IG1, IG2, IG3 is instantaneous, and that the switching point of inverting gate IG2 is equal to +V/2. The signals present at nodes N2, N3 as shown in FIG. 2 of the conventional filter F0 as shown in FIG. 1 are represented in dotted lines on the corresponding graphs of FIG. 4.

Initially, signal S0 is at a low logic value "0" (ground GND), signal S1 is at a high logic value "+V", signal S1' is the inverse of signal S1 thus S1'=0, signal S2=+V, and signal S3=0. The capacitor has its positive plate coupled to the electrical power supply by means of gate IG1, and its negative plate grounded via gate IG3. The capacitor C is therefore fully charged, such that VC=+V.

At a time t1', the signal S0 switches from 0 to +V. As a result, signal S1=0, and signal S1'=+V. The capacitor thus has its negative plate coupled to the electrical power supply by means of gate IG3, and its positive plate grounded by means of gate IG1. The capacitor is reverse polarized such that it charges and discharges between 0 and −V.

The voltage VC is equal to the potential difference between the two plates, i.e., VC=S2−S1'. Conversely, the voltage at node N2 is equal to sum of the capacitor voltage and the voltage of the signal present on the negative plate, thus S2=VC+S1'. As the capacitor C was fully charged to the positive voltage, i.e., voltage VC=+V right before time t1', the voltage at node N2 is briefly pushed to the voltage +V+V or +2*V. The voltage of the capacitor C then begins to swing from +V to −V. The voltage at node N2 decreases from +2*V, and signal S3 remains at 0.

At a time t2', the decreasing voltage at node N2 crosses the switching point +V/2 of inverting gate IG2, such that the voltage S3 switches from 0 to +V on output of gate IG2. The delay between times t1', t2' corresponds to a rise time delay d1' of the filter F1. As the voltage at node N2 was pushed to the higher voltage +2*V, the voltage at node N2 takes a greater length of time to decrease to the switching point +V/2. As a result, the delay is increased by approximately two times.

At a time t3', the signal S0 switches from +V to 0, such that the signal S1=+V, and the signal S1'=0. The capacitor C again has its positive plate coupled to the electrical power supply by means of gate IG1, and its negative plate grounded via gate IG3. As the capacitor C was fully charged to the negative voltage, i.e., voltage VC=−V right before time t3', the voltage at node N2 is briefly pulled to a negative voltage value −V, since S2=−V+0=−V. The voltage of the capacitor C then begins to swing from −V to +V. The voltage at node N2 increases, and signal S3 remains at +V.

At a time t4', the increasing voltage at node N2 crosses the switching point of the inverting gate IG2, such that the signal S3 switches from +V to 0 on output of gate IG2. The delay between times t3', t4' corresponds to a fall time delay d2' of the filter F1. Again, as the voltage at node N2 was pulled to the voltage −V, the voltage at node N2 takes a greater length of time to increase to the switching point +V/2, thus the delay is increased by approximately two times.

FIG. 4 therefore illustrates delays d1', d2' that are twice as long as delays d1, d2 shown in FIG. 2 in relation with the conventional filter F0. Assuming the same resistance R and capacitance C values, as well as pulse lengths and voltage values (GND, +V/2, +V), the delay of the low pass filter F1 is equal to $d=\tau*\ln(2)*2$ in response to a change (low to high, or high to low) occurring at the filter input node N1.

Figure 5:
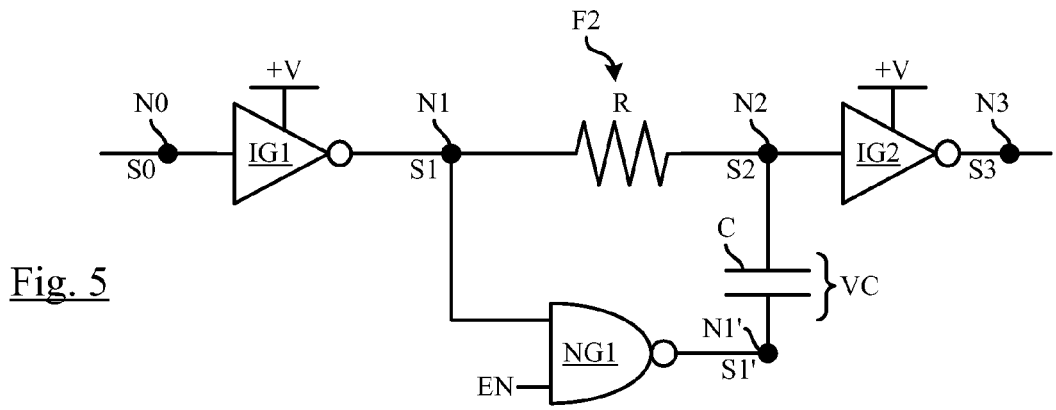
FIG. 5 shows a low pass filter according to another embodiment of the disclosure.

FIG. 5 shows a low pass filter F2 according to one embodiment, further comprising a delay altering means. Filter F2 differs from filter F1 of FIG. 3 in that a NAND gate NG1 is interposed between nodes N1, N1' instead of the inverting gate IG3.

Gate NG1 receives on one input an enable signal EN, and on another input the first logic signal S1 present at node N1. Gate NG1 supplies on output the third logic signal S1' at node N1'. As a result, when the enable signal is set to logic 0, the second terminal of the capacitor C is held at logic 1, reverse polarizing the capacitor. Thus, the capacitor C charges and discharges between 0 and −V, and the filter behaves in a manner similar to that disclosed in relation with FIG. 1. However, if the enable signal is set to logic 1, the third logic signal S1' is supplied at node N1', and the filter behaves in a manner similar to that disclosed in relation with FIG. 3.

Such a filter may therefore provide two different delays to meet an application benefiting from both a shorter delay and a longer delay, or may be regulated for one delay only depending on the customer's desires.

Figure 6:
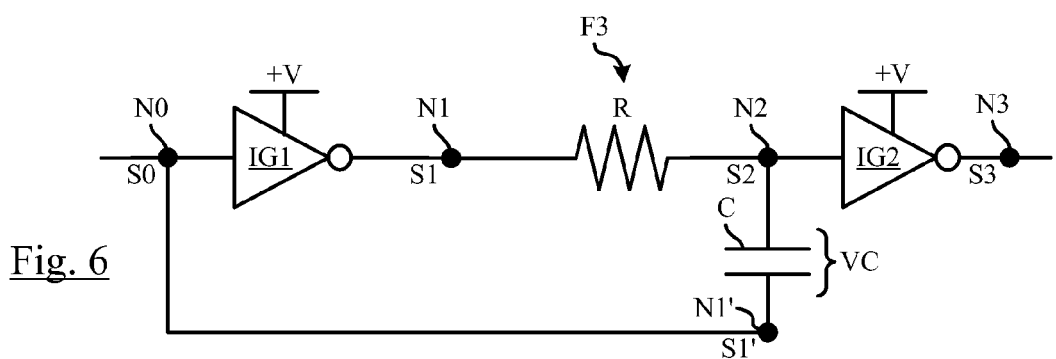
FIG. 6 shows a low pass filter according to another embodiment of the disclosure.

FIG. 6 shows a low pass filter F3 according to one embodiment. Filter F3 differs from filter F1 of FIG. 3 in that the inverting gate IG3 is not present. Instead, node N1' is coupled directly to the input of the inverting gate IG1.

It will be noted by the skilled person that in the embodiments of FIGS. 3, 5, and 6, the values at nodes N1, N1' will not switch at precisely the same time due to the presence of gates IG3, NG1, IG1 respectively. Nevertheless, it is assumed that the switching time of these gates is negligible, at least with respect to the time constant. Alternatively, a corresponding delay can be incorporated such that the signals at nodes N1, N1' switch at approximately the same time.

Figure 7:
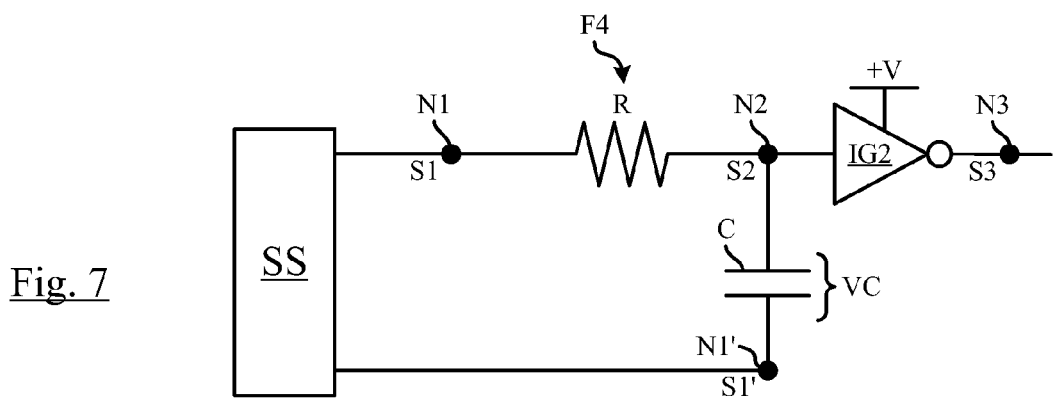
FIG. 7 shows a low pass filter according to another embodiment of the disclosure.

FIG. 7 shows a low pass filter F4 according to one embodiment o. Filter F4 differs from filter F1 of FIG. 3 in that the signals at nodes N1, N1' are supplied directly from one or more signal supply means SS. For example, the signal supply may supply two signals, one the inverse of the other, such that the logic signal at node N1 is the inverse of the logic signal at node N1'.

Figure 8:
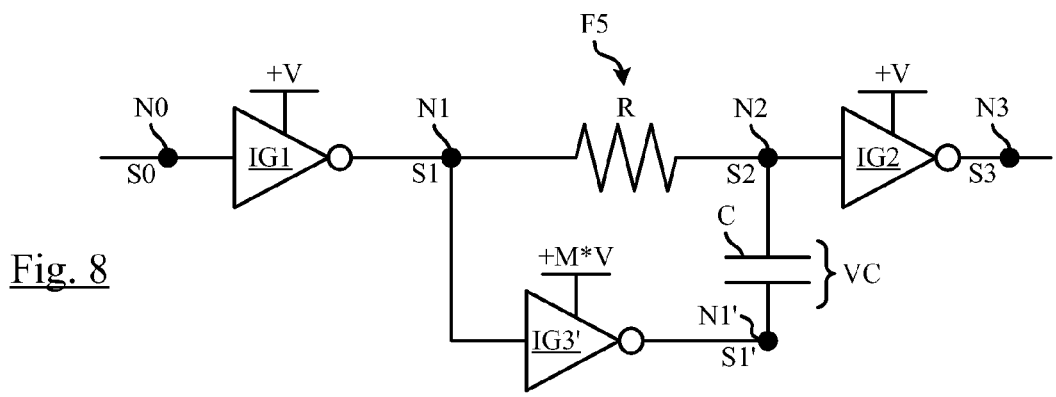
FIG. 8 shows a low pass filter according to another embodiment of the disclosure.

FIG. 8 shows a low pass filter F5 according to one embodiment. Filter F5 differs from filter F1 of FIG. 3 in that an inverting gate IG3' supplied by a voltage value +M*V is provided, whereas gates IG1, IG2 have a voltage supply +V. In this manner, the delay may be further increased.

The mathematical equation governing the delay may therefore be summarized as follows:

$$d=R*C*\ln[2*(M+1)] \quad \text{equation 1}$$

wherein M is the multiplication of the voltage value +V. Thus, instead of the voltage at node N2 varying between −V and +2*V, it will vary between −M*V and +(M+1)*V.

For the filter F1 of FIG. 3, the gates IG1, IG3 both have the voltage supply +V, thus M=1. Consequently, the delay may be expressed as $d=R*C*\ln[2(1+1)]=R*C*\ln[4]\sim R*C*1.38$. However, considering the filter F5 of FIG. 8, if gate IG1 has a voltage supply +V and gate IG3 has a voltage supply +2*V, then M=2. As a result, $d=R*C*\ln[2(2+1)]\sim R*C*1.79$.

As an illustrative example, filter F1 is considered, wherein M=1. If the delay d=100 nS as previously, the time constant τ=100/1.38=72 nS. Assuming the capacitor C=1 pF and the sheet resistance is equal to 1 kOhms/square, the resistor R=72 kOhms. The size of the resistor surface area is approximately half that for the conventional filter F0. Conversely, if as previously R=140 kOhms, C=1 pF, the delay d=140 nS*1.38=193 nS. If the filter F5 is considered, the increase in delay or decrease in size is even more pronounced for the same values. An increased delay may therefore be obtained with the same resistance and capacitance values, or else decreased resistance and capacitance values may be obtained for a same delay.

Figure 9A:
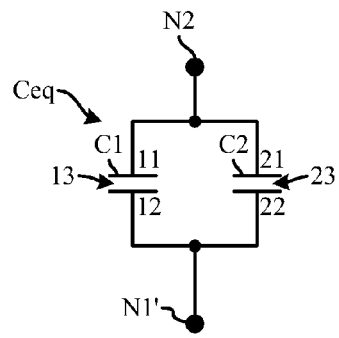
FIG. 9A shows an equivalent capacitance that may be used in a low pass filter according to various embodiments of the disclosure.

FIG. 9A shows a circuit diagram of an equivalent capacitance Ceq that may be used with any of the above-described filter embodiments. As the equivalent capacitance value Ceq of two or more capacitances C1, C2 in parallel is equal to the sum of their individual capacitance values, Ceq=C1+C2..., this property may be exploited in a filter. In particular, FIG. 9A shows two capacitors C1 and C2 connected in parallel between nodes N2, N1' to form an equivalent capacitance Ceq. Capacitor C1 has a positive plate 11, a negative plate 12, and an oxide 13 between the plates. Capacitor C2 has a positive plate 21, a negative plate 22, and an oxide 23 between the plates. As such, plates 11, 21 are coupled to node N2, and plates 12, 22 are coupled to node N1'.

Figure 9B:
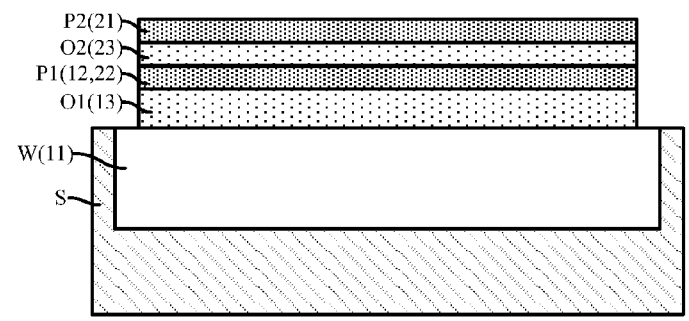
FIG. 9B shows a cross-sectional view of such an equivalent capacitance implemented on a semiconductor substrate.

FIG. 9B shows a cross-sectional view of the equivalent capacitance Ceq implemented on a semiconductor substrate. The capacitance Ceq comprises, from bottom to top, a semiconductor substrate S comprising a doped well W, a first oxide layer O1, a first polysilicon layer P1, a second oxide layer O2, and a second polysilicon layer P2. Well W, for example an n-doped well, forms plate 11 of capacitor C1. Oxide layer O1 forms oxide 13 of capacitor C1, and polysilicon layer P1 forms both plates 12 and 22 of capacitors C1, S2. Oxide layer O2 forms the oxide 23 of capacitor C2, and polysilicon layer P2 forms plate 21 of capacitor C2.

Oxide layer O1 may be thicker than oxide layer O2, and thus capable of withstanding higher voltages. In particular, capacitor C2 may be an ONO (oxide-nitride-oxide) capacitor able to withstand a lower voltage +V, and capacitor C1 may be a high voltage capacitor able to withstand a higher voltage, such that capacitor C1 can withstand the increased voltage +2*V. As a result, the time constant, rather than being t=0.7*R*C (or Ceq) as in the prior art, is equal to t=0.7*R* (2*C1+C2).

Figure 10:
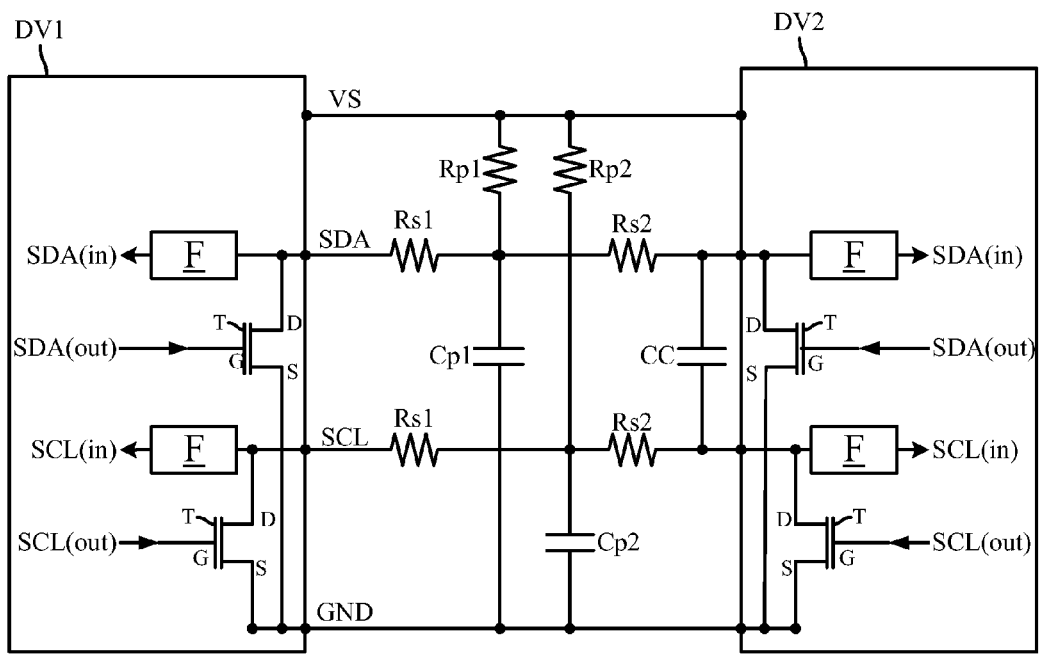
FIG. 10 shows an application example of a low pass filter according to various embodiments of the disclosure.

FIG. 10 shows an application example of a low pass filter F according to any of the embodiments described above. Two devices DV1, DV2 are coupled by an "I2C" (Inter-IC) connection comprising a voltage supply VS, a common ground GND, a serial data line SDA, and a serial clock line SCL. Lines SDA, SCL are both coupled to the voltage supply VS via pull-up resistances Rp1, Rp2, and to the common ground GND via wire capacitances Cp1, Cp2. Each line SDA, SCL further comprises serial resistances Rs1, Rs2, and a cross channel capacitance CC is present between the lines. The I2C specification calls for an "open-drain" configuration, in which a device DV1, DV2 can either pull a line SDA, SCL low, or leave it open. The resistors Rp1, Rp2, thus pull the lines to the voltage supply value if no device DV1, DV2 is pulling the lines to a low value.

Each device DV1, DV2 comprises a data input SDA(in), a clock input SCL(in), a data output SDA(out), and a clock output SCL(out). A filter (F1, F2, F3, F4, F5) generalized as F is arranged on the inputs SDA(in), SCL(in). Each output SDA(out), SCL(out) is coupled to the respective line SDA, SCL via an NMOS transistor T. The transistor is coupled on its source terminal to the common ground GND, on its drain terminal to the line SDA or SCL, and on its gate terminal to the output control.

It will be understood by the skilled person that inverting gates IG1, IG2 are not essential. It will further be understood that the capacitor C does not need to be fully charged and discharged each time. Furthermore, instead of the value ln(2) ~0.7, a different value may be provided, depending on the desired charging/discharging of the filter output node.

The skilled person will further understand that while the voltage applied to the second terminal of the capacitor C is not always the inverse of that applied to the filter input node, for example if the enable signal is set to 0, such a condition is possible or valid at least some of the time.

The terms "capacitor" and "resistor" are meant to include all capacitive and resistive elements, and may include several capacitors or resistors in series/parallel, or other devices performing resistive or capacitive functions. Further, though signal S2 is not, strictly speaking, a logic signal, it has periodic low and high voltage values.

Finally, elements of the various embodiments may be combined, such as the delay adjusting means and the M*V electrical supply, etc.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low pass filter comprising:
   a first filter node configured to receive a first logic signal;
   a second filter node configured to supply a filter signal;
   a resistive element that includes a first terminal coupled to the first filter node and a second terminal coupled to the second filter node;
   a capacitive element that includes a first terminal, coupled to the second filter node, and a second terminal;
   means for supplying a second logic signal, which is the inverse of the first logic signal, to the second terminal of the capacitive element;
   a first inverting gate having an output coupled to the first filter node; and
   a second inverting gate having an input coupled to the second filter node.

2. The filter according to claim 1, wherein the means for supplying the second logic signal comprises an electrical connection between the second terminal of the capacitive element and an input of the first inverting gate.

3. The filter according to claim 1, wherein the means for supplying the second logic signal comprises an inverting gate having an input coupled to the first filter node and an output coupled to the second terminal of the capacitive element.

4. The filter according to claim 3, wherein the inverting gate is configured to be electrically powered by a voltage supply higher than a maximum voltage of the first logic signal.

5. The filter according to claim 1, further comprising a driver configured to vary the first logic signal between a low voltage value and a first high voltage value, and the resistive element, capacitive element, and means are configured to vary the second logic signal between the low voltage value and a second high voltage value greater than the first high voltage value.

6. The filter according to claim 1, wherein the means for supplying the second logic signal comprises a delay adjusting circuit having first and second inputs respectively configured to receive an enable signal and the first logic signal, the delay adjusting circuit being configured to output the second logic signal only when an enable signal is present on the first input.

7. The filter according to claim 1, wherein the capacitive element includes two or more capacitors coupled in parallel.

8. The filter according to claim 7, wherein the two or more capacitors are stacked on a semiconductor substrate.

9. A method of filtering a first logic signal, comprising:
   applying the first logic signal to a first terminal of a resistive element;
   supplying a second logic signal that is the inverse of the first logic signal to a first terminal of a capacitive element, a second terminal of the capacitive element being coupled to a second terminal of the resistive element; and
   obtaining a filter signal from an output node coupled to the second terminals of the resistive and capacitive elements, wherein supplying a second logic signal comprises supplying the second logic signal that is the inverse of the first logic signal to the first terminal of the capacitive element only when an enable signal is present at an enable terminal of a delay adjusting circuit.

10. The method according to claim 9, wherein:
    applying the first logic signal comprises varying the first logic signal between a low voltage value and a first high voltage value; and supplying the second logic signal comprises varying the second logic signal between the low voltage value, when the first logic signal is at the first high voltage value, and a second high voltage value greater than the first high voltage value, when the first logic signal is at the low voltage value.

11. The method according to claim 9, further comprising supplying a third logic signal derived from the filter signal, including supplying a high logic value while the filter signal is below a threshold, and supplying a low logic value while the filter signal is above the threshold.

12. A device, comprising:
    a first filter signal node configured to receive a first logic signal:
    a second filter signal node configured to supply a filter signal;
    a resistive element having a first terminal coupled to the first filter signal node, and a second terminal coupled to the second filter signal node;
    a capacitive element having a first terminal, coupled to the second filter signal node, and a second terminal; and
    an inverting logic element having an input coupled to the first filter node and an output coupled to the second terminal of the capacitive element, the inverting logic element being configured to supply to the second terminal of the capacitive element a second logic signal that is inverse to the first logic signal.

13. The device of claim 12, wherein the inverting logic element is configured to receive the first logic signal at the input of the logic element and to provide the second logic signal at the output of the logic element.

14. The device of claim 13, wherein the inverting logic element comprises an enable terminal, the inverting logic element being configured to supply the second logic signal at the output of the logic element only while an enable signal is present at the enable terminal, and to otherwise supply the first logic signal at the output of the logic element.

15. The device of claim 12, comprising an output logic element having an input terminal coupled to the second filter signal node, and configured to provide a high logic value at an output terminal while a voltage at the second filter signal node is below a threshold and to provide a low logic value at the output terminal while the voltage at the second filter signal node is above the threshold.

16. A low pass filter comprising:
a first filter node configured to receive a first logic signal;
a second filter node configured to supply a filter signal;
a resistive element that includes a first terminal coupled to the first filter node and a second terminal coupled to the second filter node;
a capacitive element that includes a first terminal, coupled to the second filter node, and a second terminal; and
means for supplying a second logic signal, which is the inverse of the first logic signal, to the second terminal of the capacitive element, wherein the means for supplying the second logic signal comprises an inverting gate having an input coupled to the first filter node and an output coupled to the second terminal of the capacitive element.

17. The filter according to claim 16, wherein the inverting gate is configured to be electrically powered by a voltage supply higher than a maximum voltage of the first logic signal.

18. A low pass filter comprising:
a first filter node configured to receive a first logic signal;
a second filter node configured to supply a filter signal;
a resistive element that includes a first terminal coupled to the first filter node and a second terminal coupled to the second filter node;
a capacitive element that includes a first terminal, coupled to the second filter node, and a second terminal;
means for supplying a second logic signal, which is the inverse of the first logic signal, to the second terminal of the capacitive element; and
a driver configured to vary the first logic signal between a low voltage value and a first high voltage value, and the resistive element, capacitive element, and means are configured to vary the second logic signal between the low voltage value and a second high voltage value greater than the first high voltage value.

19. The filter according to claim 18, wherein the means for supplying the second logic signal comprises a delay adjusting circuit having first and second inputs respectively configured to receive an enable signal and the first logic signal, the delay adjusting circuit being configured to output the second logic signal only when an enable signal is present on the first input.

20. A low pass filter comprising:
a first filter node configured to receive a first logic signal;
a second filter node configured to supply a filter signal;
a resistive element that includes a first terminal coupled to the first filter node and a second terminal coupled to the second filter node;
a capacitive element that includes a first terminal, coupled to the second filter node, and a second terminal; and
means for supplying a second logic signal, which is the inverse of the first logic signal, to the second terminal of the capacitive element, wherein the means for supplying the second logic signal comprises a delay adjusting circuit having first and second inputs respectively configured to receive an enable signal and the first logic signal, the delay adjusting circuit being configured to output the second logic signal only when an enable signal is present on the first input.

21. The filter according to claim 20, wherein the means for supplying the second logic signal comprises an inverting gate having an input coupled to the first filter node and an output coupled to the second terminal of the capacitive element.

22. A method of filtering a first logic signal, comprising:
applying the first logic signal to a first terminal of a resistive element;
supplying a second logic signal that is the inverse of the first logic signal to a first terminal of a capacitive element, a second terminal of the capacitive element being coupled to a second terminal of the resistive element; and
obtaining a filter signal from an output node coupled to the second terminals of the resistive and capacitive elements, wherein:
applying the first logic signal comprises varying the first logic signal between a low voltage value and a first high voltage value; and supplying the second logic signal comprises varying the second logic signal between the low voltage value, when the first logic signal is at the first high voltage value, and a second high voltage value greater than the first high voltage value, when the first logic signal is at the low voltage value.

23. The method according to claim 22, further comprising supplying a third logic signal derived from the filter signal, including supplying a high logic value while the filter signal is below a threshold, and supplying a low logic value while the filter signal is above the threshold.

* * * * *